(12) United States Patent
Cline et al.

(10) Patent No.: US 6,211,674 B1
(45) Date of Patent: Apr. 3, 2001

(54) METHOD AND SYSTEM FOR PROVIDING A MAXIMUM INTENSITY PROJECTION OF A NON-PLANAR IMAGE

(75) Inventors: Harvey Ellis Cline; Christopher Judson Hardy, both of Schenectady, NY (US); Charles Lucian Dumoulin, London (GB)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/311,875

(22) Filed: May 14, 1999

(51) Int. Cl.[7] ....................................... G01V 3/00
(52) U.S. Cl. ........................ 324/307; 324/309; 324/312
(58) Field of Search .................................. 324/307, 309, 324/312; 382/128, 204, 170

(56) References Cited

U.S. PATENT DOCUMENTS

| | | | |
|---|---|---|---|
| 4,984,157 | 1/1991 | Cline et al. | 364/413.13 |
| 5,226,113 | 7/1993 | Cline et al. | 395/124 |
| 5,233,299 | * 8/1993 | Souza et al. | 324/307 |
| 5,512,827 | 4/1996 | Hardy et al. | 324/309 |
| 5,514,962 | 5/1996 | Cline et al. | 324/309 |
| 5,812,691 | * 9/1998 | Udupa et al. | 382/128 |

* cited by examiner

*Primary Examiner*—Christine Oda
*Assistant Examiner*—Brij B. Shrivastav
(74) *Attorney, Agent, or Firm*—Marvin Snyder; Douglas E. Stoner (57) ABSTRACT

An imaging method and system generates images of non-planar portions of a three dimensional data point array wherein the non-planar portion corresponds to a non-planar object. The method includes selecting at least two different intermediate imaging planes, each selected plane including at least a portion of the object to be imaged, generating cross-sectional views perpendicular to each intermediate plane, selecting a viewing plane, projecting the cross-sectional views onto the viewing plane to generate transition value sets, and combining the transition value sets to generate values for each pixel in a display.

20 Claims, 6 Drawing Sheets

METHOD AND SYSTEM FOR PROVIDING A MAXIMUM INTENSITY PROJECTION OF A NON-PLANAR IMAGE

BACKGROUND OF THE INVENTION

This invention relates to nuclear magnetic resonance (NMR) imaging methods and systems and, more particularly, to a method and apparatus for generating a maximum intensity projection image of a tortuous and non-planar vessel.

The present invention can be used with imaging techniques (e.g. NMR, positron emission tomography or PET, computerized tomography or CT, etc.) that generate a three-dimensional data point array which is then used to generate an image for viewing on a two-dimensional screen. To simplify the explanation, the invention is described in the context of an NMR system.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins".

While many different tissue samples and various bodies may be examined using NMR imaging, the invention, for simplicity, is described in the context of an exemplary transaxial volume through a patient's body wherein the volume includes the patient's heart. This volume is herein referred to as a region of interest. In addition, it is assumed that an NMR imaging system includes a three dimensional imaging area having Cartesian coordinate x, y and z axes and that the patient is positioned within the imaging area with the patient's height (i.e. from head to feet) defining an axis along the z axis.

When the region of interest is subjected to a uniform magnetic field (polarizing field $B_0$), the individual magnetic moments of the spins in the region attempt to align with the polarizing field, but precess about the direction of the field in random order at their characteristic Larmor frequencies. A net magnetic moment $M_z$ is produced in the direction of the polarizing field, but the randomly oriented magnetic components in the perpendicular, or transverse, plane (x–y plane) cancel one another.

If, however, the region of interest is subjected to a magnetic field (excitation field $B_1$) which is in the x-y plane and which is near the Larmor frequency, the net aligned moment Mz may be "tipped" into the x–y plane to produce a net transverse magnetic moment $M_t$ which is rotating or spinning in the x–y plane at the Larmor frequency.

The practical value of this phenomenon resides in the signal emitted by the excited spins after the excitation signal $B_1$ is terminated. The emitted signal is a function of at least one and typically several physical properties of the spin which generates the signal and therefore, by examining the emitted signal, the properties of the spin can be determined. The emitted NMR signals are digitized and processed to generate an NMR data set.

To be useful, an NMR data set requires that the point of origin of each NMR signal sensed be known. To determine the point of origin of an NMR signal, each NMR signal is encoded with special information. An exemplary position encoding technique is commonly referred to as "spin-warp" and is discussed by W. A. Edelstein et al. in "Spin Warp NMR Imaging and Applications to Human Whole-Body Imaging", *Physics in Medicine and Biology*, Vol. 25, pp. 751–756 (1980) which is incorporated herein by reference.

In the spin-warp technique, special encoding is accomplished by employing three magnetic gradient fields ($G_x$, $G_y$, and $G_z$) which have the same direction as polarizing field $B_0$ and which have gradients along the x, y and z axes, respectively. By controlling the strength of these gradients during each NMR cycle, the spatial distribution of spin excitation can be controlled and the point of origin of the resulting NMR signals can be identified.

A generally useful acquisition technique is known as a slice or two dimensional technique wherein NMR data are acquired for each of several single transaxial slices of a region of interest consecutively, and then the slices are "stacked" together to form a three dimensional data set.

To determine the z-axis origin of a signal, signal generation during slice data acquisition is limited to a specific transaxial slice of the region of interest, at one time, using gradient field $G_z$. To this end, the Larmor frequency F of a spin can be expressed as:

$$F=(B_0+B_z)\gamma \qquad (1)$$

where $B_z$ is essentially the strength of gradient $G_z$ within a specific transaxial slice of the region of interest. Because the gradient field strength varies along the z-axis, each z-axis slice has a different Larmor frequency F. When the excitation signal $B_0$ is provided at a specific excitation frequency, only those spins within the "selected" z-axis slice which are at the excitation frequency are tipped. Therefore, when the excitation signal $B_0$ is turned off, only spins within the selected z-axis slice generate NMR signals.

A similar technique is used to spatially encode NMR signals along the x axis. To this end, instead of providing a single excitation signal $B_0$ frequency, excitation signal $B_0$ is provided at a small range of frequencies. The x axis gradient $G_x$ is small enough that all of the spins along the x axis have Larmor frequencies within the small range of excitation signal frequencies and therefore each of the spins along the x axis generates an NMR signal when the excitation signal is turned off, each x-axis NMR signal having a unique and identifiable frequency. Hence, x-axis position can be determined by identifying the frequency of each NMR signal received during an acquisition. Because x axis position is encoded using signal frequency, this type of encoding is known as frequency encoding.

To encode y axis position within NMR signals the y axis gradient $G_y$ is employed to cause spins along the y axis to have different phases. Consequently, NMR signals resulting from spins along the y axis have different phases which can be used to determine y axis position. Because y axis position is encoded using signal phase, this type of encoding is known as phase encoding.

After data have been acquired for one region of interest slice, the acquisition process is repeated for adjacent regions of interest slices until data have been acquired for every slice within the region of interest. After digitizing and processing, the slice data are combined to provide a three dimensional data point (TDDP) array representing one or more physical properties at regular grid positions within the interior of the region of interest. The TDDP array includes a plurality of sets of three dimensional (x,y,z) coordinates distributed at regular positions in a lattice within the region of interest, at least one value (Vxyz) of the physical property being associated with each respective one of the coordinate positions. Each cubically adjacent set of eight such positions defines a cubic volume, or "voxel", with a physical property value specified for each of the eight voxel vertices.

After a complete TDDP array has been acquired and stored, the array can be used to form an image of the region of interest using one of many well known reconstruction techniques. Typical imaging screens used to display NMR images are only two dimensional. Thus, while shading and the like can give the appearance of a three dimensional image, in reality only two dimensions of pixels can be displayed at any given time. This hardware constraint requires that certain decisions be made as to what aspects of the TDDP array are important for examination purposes.

For example, assume a TDDP array is observed from a specific perspective "viewing angle" wherein array data point columns are perpendicular to, and along the line of sight of, the viewing angle. In examining data points along one of the columns, if a bright data point is behind a dim data point, then, from the perspective view, the bright data point would be "hidden" and valuable information in the image might be lost. This is true of each of the data point columns. This problem is exacerbated because NMR systems generate an appreciable amount of electromagnetic noise which is reflected in a TDDP array, and a perspective view including data point intensities from only the most proximate array within data point columns would be relatively useless as many of the intensities correspond to noise. Consequently, in most cases after array data has been collected and stored, a subset of data is selected for generating an image. For example, one useful visualization technique is known as a maximum intensity projection (MIP). To form a MIP, a specific array viewing angle is selected wherein data point columns are along the viewing angle line of sight. For each column, a processor selects the highest intensity data point in the column and provides that data point in an associated two dimensional array of data points for display on the imaging screen. This MIP technique is valuable in that the MIP image is relatively noise free (i.e. is not dominated by noise) and provides an image which is akin to an x-ray.

Another useful visualization technique is to select a transaxial slice through an NMR data set which is parallel to one of the x, y and z axes so that a cross sectional view of the data, and hence the region of interest, is obtained. This cross section technique allows a physician to observe the detailed spatial relationship between internal structures within the region of interest for diagnosing and prescribing purposes.

One other useful visualization technique is known as oblique reformatting. The industry has generally recognized that in many instances it is desirable to select a cross sectional slice through an NMR data set which is orthogonal to a structural interface and which may form some oblique angle (hence the phrase "oblique imaging") to the orientation of the data acquisition slices. For example, it may be advantageous to observe the length of a vessel which traverses various x, y and z coordinates within the three dimensional data array.

Cline et al. U.S. Pat. No. 4,984,157, "System and Method for Displaying Oblique Planar Cross Sections of a Solid Body Using Tri-Linear Interpolation To Determine Pixel Position Data", issued Jan. 8, 1991 and assigned to the instant assignee (hereinafter "the '157 patent"), is incorporated herein by reference. The '157 patent teaches one method and apparatus for selecting oblique reformatting planes and thereafter converting data point intensities to pixel intensities for display in the oblique image plane.

As an alternative to generating a TDDP array and oblique reformatting thereafter to generate oblique images, oblique image data can be acquired initially via an oblique slice through a patient's body and the acquired data can then be used, without reformatting, to generate a desired oblique image. Methods to acquire oblique image data are well known in the art.

Unfortunately, even conventional oblique imaging techniques have several shortcomings. One shortcoming of oblique imaging is that many vessels are tortuous, so that the vessel is not neatly contained within a single imaging plane. For example, the coronary arteries which are formed on an external surface of the heart are tortuous and multi-planar. In this instance, while a first portion of a vessel may be imageble via selection of a proper oblique imaging plane, other portions of the vessel which lie in different planes cannot be imaged along with the first portion. In addition, where a selected oblique plane passes through one or more heart chambers which include blood pools, the blood obfuscates the resulting image.

SUMMARY OF THE INVENTION

An exemplary embodiment of the invention includes a method for selecting a plurality of imaging planes which are tangent to different sections of a tortuous vessel and which are often non-planar, combining the data point intensities from each of the images into a single image, and then generating a MIP of the combined images to provide a relatively complete image of the tortuous vessel.

In the exemplary embodiment of the invention, different intermediate planes through a region of interest are selected consecutively and separate intermediate sets of data corresponding to each plane are generated. Each intermediate set is a cross sectional view of the region of interest along an associated intermediate plane. A viewing plane is also selected which indicates the perspective of an image to be displayed. After the viewing angle is selected and the intermediate data sets are generated, the intermediate data sets are combined to generate values for display element positions associated with the viewing plane. Thereafter, the viewing plane element values are used to drive a display for displaying an image of the tortuous vessel from the viewing plane perspective.

DESCRIPTION OF A PREFERRED EMBODIMENT

I. SYSTEM HARDWARE

Figure 1:
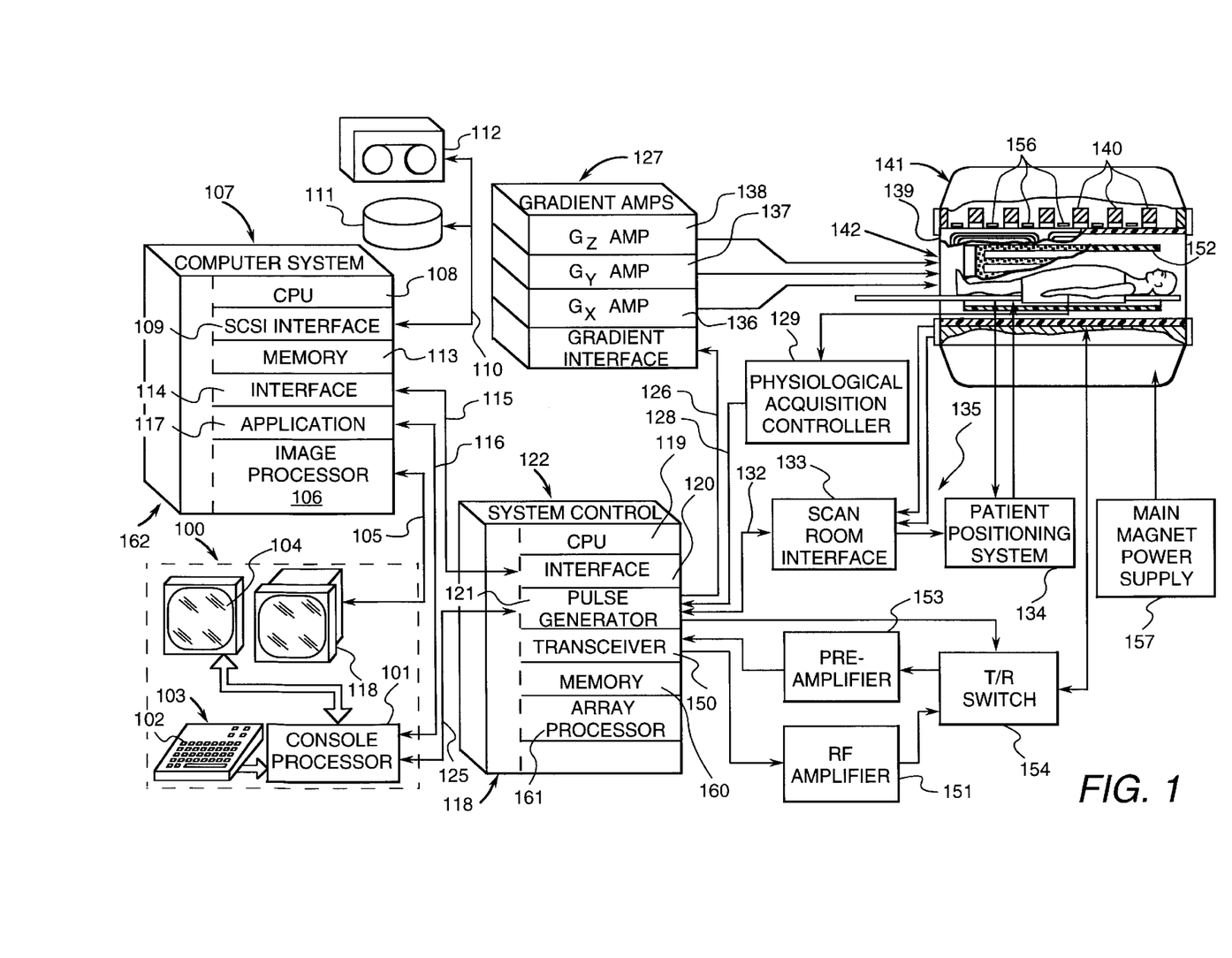
FIG. 1 is a block diagram of an NMR system which employs a preferred embodiment of the invention.

FIG. 1 illustrates the major components of a preferred NMR system which incorporates the present invention and is sold by the General Electric Company under the trademark "SIGNA". The system generally includes an operator control console 100, a computer system 107, a system control 122, a set of gradient amplifiers 127, a physiological acquisition controller 129, a scan room interface 133, a patient positioning system 134, a magnet assembly 141, a preamplifier 153, an RF (radio frequency) power amplifier 151, a transmit/receive switch 154, a power supply 157, data storage devices 111 and 112 and various data lines and busses which link the aforementioned components.

The system is controlled from console 100 which includes a console processor 101 that scans a keyboard 102 and is controlled by a human operator through a control panel 103 and a plasma display/touch screen 104. Console processor 101 communicates through a communications link 116 with an application interface module 117 in computer system 107. Through keyboard 102 and controls 103, an operator controls the production and display of images by an image processor 106 in computer system 107, which is coupled to a video display 118 on console 100 through a video cable 105.

Display 118 includes a two dimensional array of pixels and is driven by a display driver (not shown in FIG. 1) to generate medical images for observation by a system user.

Computer system 107 includes a number of modules which communicate with each other through a backplane 162. In addition to application interface 117 and image processor 106, other system 107 modules include a CPU module 108 for controlling the backplane, and an SCSI interface module 109 which couples computer system 107 through a bus 110 to a set of peripheral devices, including disk storage 111 and tape drive 112, for storing data during NMR signal acquisition and subsequent processing. Computer system 107 also includes a memory module 113, known in the art as a frame buffer, for storing image data arrays, and a serial interface module 114 which links computer system 107 through a high speed serial link 115 to a system interface module 120 of a system control cabinet 122.

System control 122 includes a series of modules interconnected by a common backplane 118. Backplane 118 is comprised of a number of bus structures, including a bus structure controlled by a CPU module 119. A serial interface module 120 couples backplane 118 to high speed serial link 115, and a pulse generator module 121 couples backplane 118 to operator console 100 through a serial link 125. Through serial link 125, system control 122 receives commands from the operator which call for performance of a scan sequence.

Pulse generator module 121 operates the system components to carry out the desired scan sequence, producing data which indicate the timing, strength and shape of RF pulses that are to be produced, and the timing of, and length of, a data acquisition window. Pulse generator module 121 is also coupled through serial link 126 to the set of gradient amplifiers 127, and conveys data thereto which indicate the timing and shape of the gradient pulses to be produced during the scan. Pulse generator module 121 also receives patient data through a serial link 128 from physiological acquisition controller 129. Physiological acquisition controller 129 can receive a signal from a number of different sensors connected to the patient; for example, it may receive electrocardiogram (ECG) signals from electrodes or respiratory signals from a bellows, and produce pulses for pulse generator module 121 that synchronizes the scan with the patient's cardiac cycle or respiratory cycle. Pulse generator module 121 is also coupled through a serial link 132 to scan room interface circuit 133 which receives signals at inputs 135 from various sensors associated with the position and condition of the patient and the magnet system. It is also through scan room interface circuit 133 that patient positioning system 134 receives commands which move the patient cradle and transport the patient to the desired position for the scan.

The gradient waveforms produced by pulse generator module 121 are applied to gradient amplifier system 127 which is comprised of $G_x$, $G_y$ and $G_z$ amplifiers 136, 137 and 138, respectively. Each amplifier 136, 137 and 138 is utilized to excite a corresponding gradient coil in an assembly 139. Gradient coil assembly 139 forms part of magnet assembly 141 which includes a main or polarizing magnet 140, typically superconductive, for producing a polarizing field such as a 0.5 or a 1.5 Tesla polarizing field which extends horizontally through a bore 142 in the magnet assembly. Gradient coils 139 encircle bore 142 and, when energized, coils 139 generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field $B_0$ generated by main magnet 140 is directed in the z direction, and the total magnetic field in the z direction is $B_z$, then $G_x = \partial B_z/\partial x$, $G_y = \partial B_z/\partial y$ and $G_z = \partial B_z/\partial z$, and the magnetic field at any point (x,y,z) in the bore 142 of magnet assembly 141 is given by $B(x,y,z) = B_0 + G_x x + G_y y + G_z z$. The gradient magnetic fields are utilized to encode spatial information into the NMR signals emanating from the patient being scanned.

Located within bore 142 is a circular cylindrical whole-body RF coil 152 which produces a circularly polarized RF field in response to RF pulses provided by a transceiver module 150 in system control cabinet 122. These pulses are amplified by RF amplifier 151 and coupled to an RF coil 152 by transmit/receive switch 154. Waveforms and control signals are provided by pulse generator module 121 and utilized by transceiver module 150 for RF carrier modulation and mode control. The resulting NMR signals radiated by the excited nuclei in the patient may be sensed by the same RF coil 152 and coupled through transmit/receive switch 154 to preamplifier 153. The amplified NMR signals are demodulated, filtered, and digitized in the receiver section of transceiver 150. Transmit/receive switch 154 is controlled by a signal from pulse generator module 121 to couple RF amplifier 151 to coil 152 during the transmit mode and to couple coil 152 to preamplifier 153 during the receive mode. Transmit/receive switch 154 also enables a separate RF coil (for example, a head coil or surface coil) to be used in either the transmit or receive mode.

In addition to supporting polarizing magnet 140, gradient coils 139 and RF coil 152, the main magnet assembly 141 also supports a set of shim coils 156 associated with main magnet 140 and used to correct inhomogeneities in the polarizing magnet field. The main power supply 157 is utilized to bring the polarizing field produced by superconductive main magnet 140 to the proper operating strength and is then disconnected from the magnet.

The NMR signals picked up by RF coil 152 are digitized by transceiver module 150 and transferred to a memory module 160 which is part of system control 122. When the scan is completed and an entire array of data has been acquired in memory module 160, an array processor 161 operates to Fourier transform the data into an array of image data. This array of image data is conveyed through serial link 115 to computer system 107 and stored in disk memory 111. In response to commands received from operator console 100, this array of image data may be archived on tape drive 112, or it may be further processed by image processor 106 and conveyed to the operator console and presented on video display 118.

Figure 2:
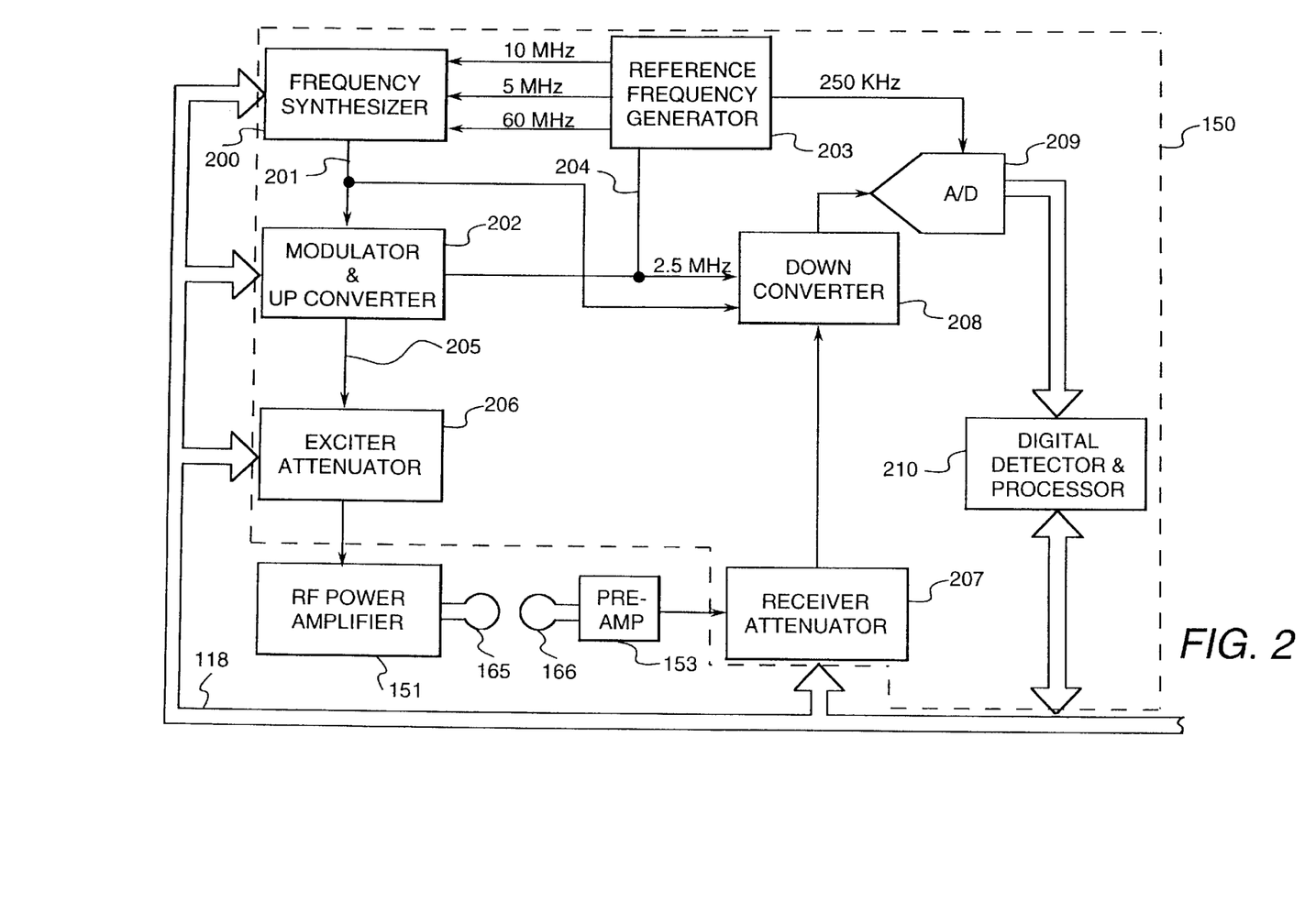
FIG. 2 is an electrical block diagram of the transceiver which forms part of the NMR system of FIG. 1.

As shown in FIGS. 1 and 2, transceiver 150 includes components which produce an RF excitation field $B_1$ through power amplifier 151 at a coil 152 and components which receive the resulting NMR signal induced in a coil. As indicated above, the coils 152 may be a single wholebody coil as shown in FIG. 1. The base, or carrier, frequency of the RF excitation field is produced under control of a frequency synthesizer 200 which receives a set of digital signals (CF) through backplane 118 from CPU module 119 and pulse generator module 121. These digital signals indicate the frequency and phase of the RF carrier signal which is produced at an output 201 of the synthesizer. The commanded RF carrier is applied to a modulator and up converter 202 where its amplitude is modulated in response to a signal R(t) also received through backplane 118 from pulse generator module 121. The signal R(t) defines the envelope, and therefore the bandwidth, of the RF excitation pulse to be produced. The RF excitation pulse is produced in module 121 by sequentially reading out a series of stored digital values that represent the desired envelope. These stored digital values may, in turn, be changed from the operator console to enable any desired RF pulse envelope to be produced. Modulator and up converter 202 produces an RF pulse at the desired Larmor frequency at an output 205.

The magnitude of the RF excitation pulse output is attenuated by an exciter attenuator circuit 206 which receives a digital command TA from backplane 118. The attenuated RF excitation pulses are applied to RF power amplifier 151 driving RF coil 165. For a more detailed description of this portion of transceiver 122, reference is made to Stormont et al. U.S. Pat. No. 4,952,877 issued Aug. 28, 1990, which is assigned to the instant assignee and incorporated herein by reference.

The NMR signal produced by the patient is picked up by receiver coil 166 and applied through preamplifier 153 to the input of a receiver attenuator 207 which further amplifies the NMR signal and attenuates the signal by an amount determined by a digital attenuation signal (RA) received from backplane 118. The receive attenuator 207 is also turned on and off by a signal from pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal from frequency synthesizer 200 and then mixes the resulting difference signal with a reference signal, from a reference frequency generator 203 on line 204, of 2.5 MHz in a preferred embodiment. The resulting down converted NMR signal from down converter 208 has a maximum bandwidth of 125 kHz and is centered at a frequency of 187.5 kHz. The down converted NMR signal is applied to the input of an analog-to-digital (A/D) converter 209 which samples and digitizes the analog signal at a rate of 250 kHz in a preferred embodiment. The output signal of A/D converter 209 is applied to a digital detector and signal processor 210 which produces 16-bit in-phase (I) values and 16-bit quadrature (Q) values corresponding to the received digital signal. The resulting stream of digitized I and Q values of the received NMR signal is furnished through backplane 118 to memory module 160 where it is employed to reconstruct an image.

To preserve the phase information contained in the received NMR signal, both the modulator and up converter 202 and down converter 208 are operated with common signals. More particularly, the carrier signal at the output 201 of frequency synthesizer 200 and the 2.5 MHz reference signal at the output 204 of reference frequency generator 203 are employed in both frequency conversion processes. Phase consistency is thus maintained and phase changes in the detected NMR signal accurately indicate phase changes produced by the excited spins. The 2.5 MHz reference signal, as well as 5, 10 and 60 MHz reference signals, are produced by reference frequency generator 203 from a common 20 MHz master clock signal. The latter three reference signals are employed by frequency synthesizer 200 to produce the carrier signal on output line 201. For a more detailed description of the receiver, reference is made to Stormont et al. U.S. Pat. No. 4,992,736, issued Feb. 12, 1991, which is assigned to the instant assignee and incorporated herein by reference.

While the invention finds application in imaging any of several different types of structures (e.g. vessels, chambers, etc.), it is here described in the context of imaging a coronary artery on the surface of a human heart. To this end, it is assumed that a full set of NMR imaging data of a region of interest, which includes a patient's heart and specifically includes the artery to be imaged, has been acquired and processed to generate a TDDP array indicating at least one property of the region of interest. For example, the physical properties of the TDDP array may be spin-spin or lattice-spin relaxation times as are well known in the NMR field.

A TDDP array includes adjacent cubic voxel elements, each element having eight vertices. Associated with each vertex is one data value which represents the physical property at the corresponding spatial position within the region of interest. The spatial positions are located in regular patterns defining regularly spaced grid locations within the body. The grid locations in turn define a plurality of adjacent voxels within the region. For purposes of this explanation it will be assumed that the grid positions are aligned with the x, y and z axes of bore 142 where the z axis is along the bore length, the x axis is horizontal and the y axis is vertical.

Figure 5:
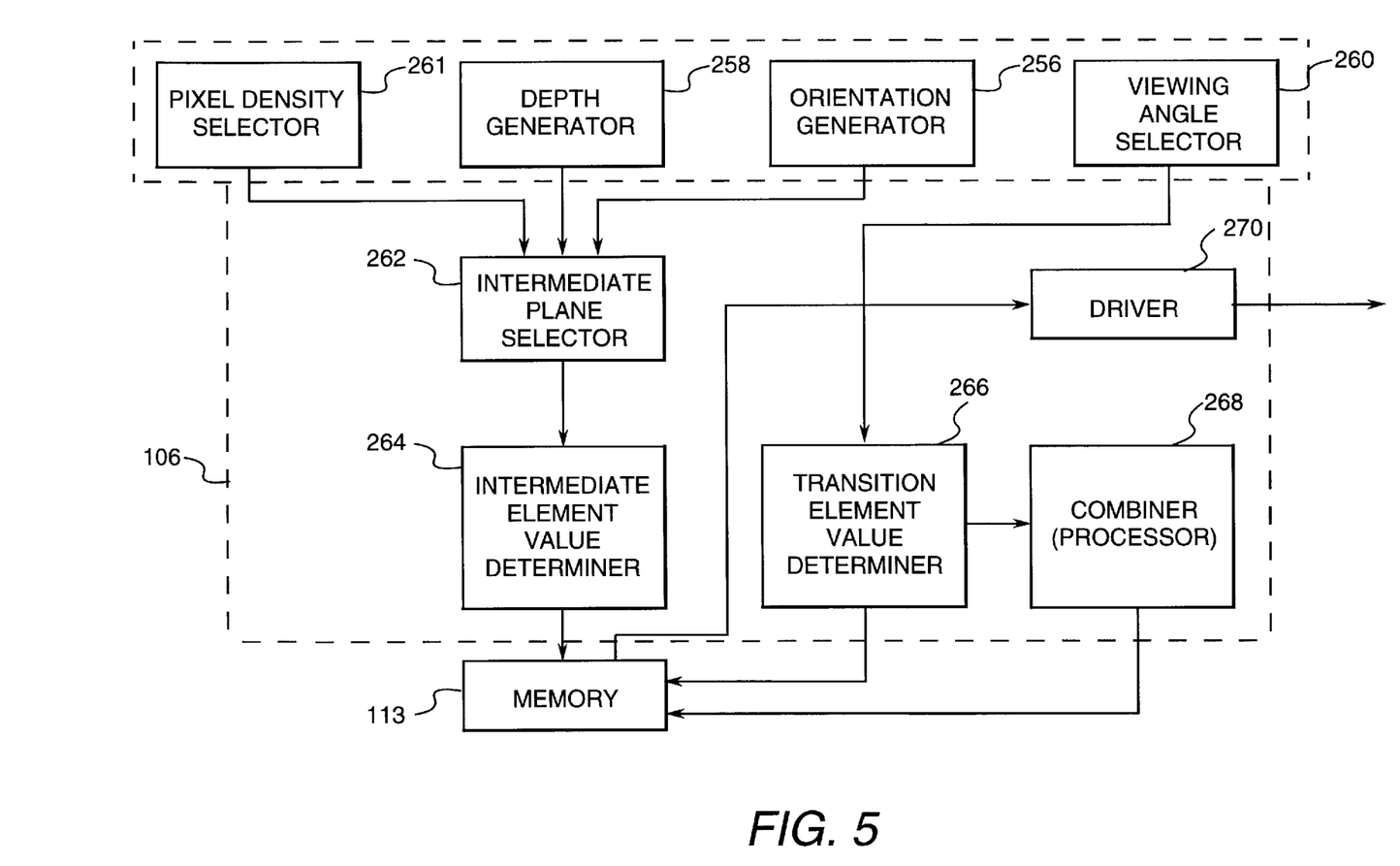
FIG. 5 is a block diagram of image processor components employed in the system shown in FIG. 1.

Referring again to FIG. 1 and also to FIG. 5, in one embodiment of the invention panel 103 includes an orientation generator 256, a depth generator 258, a viewing angle selector 260 and a pixel density selector 261. In this embodiment image processor 106 includes an intermediate plane selector 262, an intermediate element value determiner 264, a transition element value determiner 266, a combiner or processor 268 and a video or display driver 270.

Orientation generator 256 allows a user to specify the angular orientation of a cut plane through the region of interest along which a cross sectional image is to be generated. This orientation can be specified by two angles, one from the x plane and one from the z plane. Such angular input data can be specified by joystick, rheostat, keyboard, mouse or any other suitable input device. In the preferred embodiment a track ball having two degrees of angular freedom is used to specify cut plane orientation. The x and z axis angle signals are provided to intermediate plane selector 262.

Depth generator 258 selects the depth of the cut plane from the coordinate origin at the outer surface of the region of interest. The depth generator, like the orientation generator, may be any type of suitable input device. The depth signal is provided to intermediate plane selector 262.

Pixel density selector 261 allows a user (operator) to select a pixel density for an intermediate plane. In the alternative, selector 261 may not be utilized and the pixel density may automatically be set to the display screen 118 pixel density or, for intermediate planes, to some other suitable density value. The density signal is provided to intermediate plane selector 262.

Intermediate plane selector 262 receives each of the selected angle, selected depth and pixel density signals from generators 256, 258 and pixel density selector 261, respectively, and identifies an intermediate plane specified by the angles and depth signal and having an element or pixel density specified by the pixel density signal.

The intermediate plane data are provided to intermediate element value determiner 264 which determines the value of each element in the intermediate plane as a function of the data point values of the eight vertices which enclose the element. Thereafter, the intermediate element values for the specific intermediate plane are stored in memory 113 as a first intermediate element value set.

Next, the operator uses depth generator 258, orientation generator 256 and pixel density selector 261 to select other intermediate planes which cut through the region of interest and to select the density of each intermediate plane causing intermediate plane selector 262 and intermediate element value determiner 264 to generate other intermediate element value sets which are all stored in memory 113. In effect, each intermediate element value set includes data corresponding to a separate cross sectional view through the region of interest along the corresponding intermediate plane.

The '157 patent, referred to previously, teaches the preferred system for selecting oblique imaging planes and using three dimensional data points to generate intermediate element position values corresponding to oblique cross sectional views, and should be referred to for more detail in this regard.

Viewing angle selector 260 allows an operator to select an angle from which to view the cross sectional views corresponding to all, or a subset of, the intermediate element value sets. To this end, selector 260, like orientation generator 256, includes any of several different suitable interface devices (i.e. trackball, keyboard, joystick, etc.). When a viewing angle is selected, the two dimensions perpendicular to the selected angle are identified as axes x' and y'. In addition, a viewing plane is identified which includes a two dimensional array of pixel positions corresponding to the pixel density of display 118 (see FIG. 1) arranged within the x'-y' plane. The viewing angle, including pixel positions in the viewing plane, is provided to transition element value determiner 266.

Transition element value determiner 266, upon receiving the viewing plane, retrieves the intermediate element value sets from memory 113 and generates a three dimensional data point construct including a data point for each intermediate element value in the retrieved intermediate element value sets. Geometrically speaking, the three dimensional data point construct simply includes a series of interconnected intermediate planes. Determiner 266 next identifies the dimensions of the data point construct in the x'-y' plane, compares the data point construct dimensions to the dimensions of the screen of display 118, and scales the entire data point construct either up or down, depending on the difference between the screen dimensions and the array x' and y' dimensions.

After scaling the three dimensional data point construct, for each scaled intermediate value set, transition element value determiner 266 projects the value set onto the viewing plane pixel positions in the x'-y' plane, thereby generating viewing plane element position values for most pixels in the viewing plane.

The term "projecting" is used figuratively to describe the mathematical process of determining the values of the viewing plane element. In reality, observing a scaled intermediate element value set along a ray perpendicular to the x'-y' plane and through a viewing plane pixel or element position, at least one, and often several, data points in the scaled value set are observable. The projecting process involves determining the percentage of each viewing plane pixel or element position which is subtended by each observable intermediate element value and causing the viewing plane element position value to be proportional to the values of the observable intermediate element values and their respective percentages. For example, if one half of a viewing plane element position is subtended by a first intermediate element value having a relative intensity of 10 and the second half of the viewing plane element position is subtended by a second intermediate element value having a relative intensity of 5, the resulting viewing plane element position value would be 7.5 (i.e. (10+5)/ 2=7.5).

The transition elements corresponding to each intermediate element value set are stored as a transition element value set in memory 113. Thus, for each intermediate value set, transition element value determiner 266 generates a separate transition element value set, each transition set being in the x'–y' plane and having a density equal to the density of display 118. The dimensions of transition sets may overlap and typically correspond to a fraction of the display 118 dimensions.

After all of the transition sets have been generated, combiner 268 retrieves the transition sets and combines the transition sets to generate a separate viewing plane element position value for each display pixel. Preferably, combiner 268 combines by performing a maximum intensity projection (MIP) on the transition sets, thereby providing data for generating a two dimensional image on display 118 (see FIG. 1). The MIP data (i.e. viewing element position values) are stored in memory 113.

Driver 270 retrieves the MIP data and uses that data to drive display 118 in any of several different manners which are well known in the industry.

II. OPERATION

Figure 3:
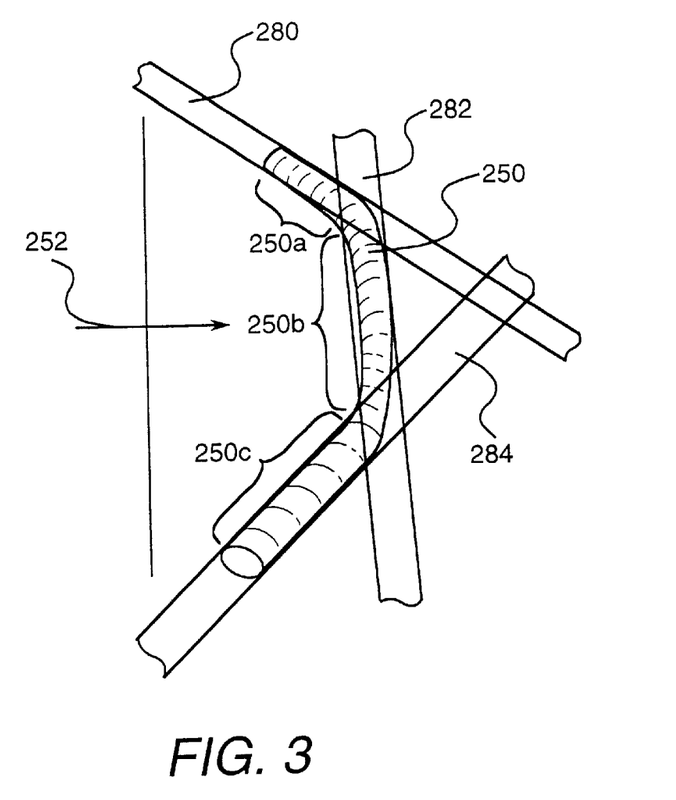
FIG. 3 is a schematic illustration of a portion of a coronary artery, three selected intermediate planes through the artery, and a viewing angle according to a preferred embodiment of the invention.
Figure 6:
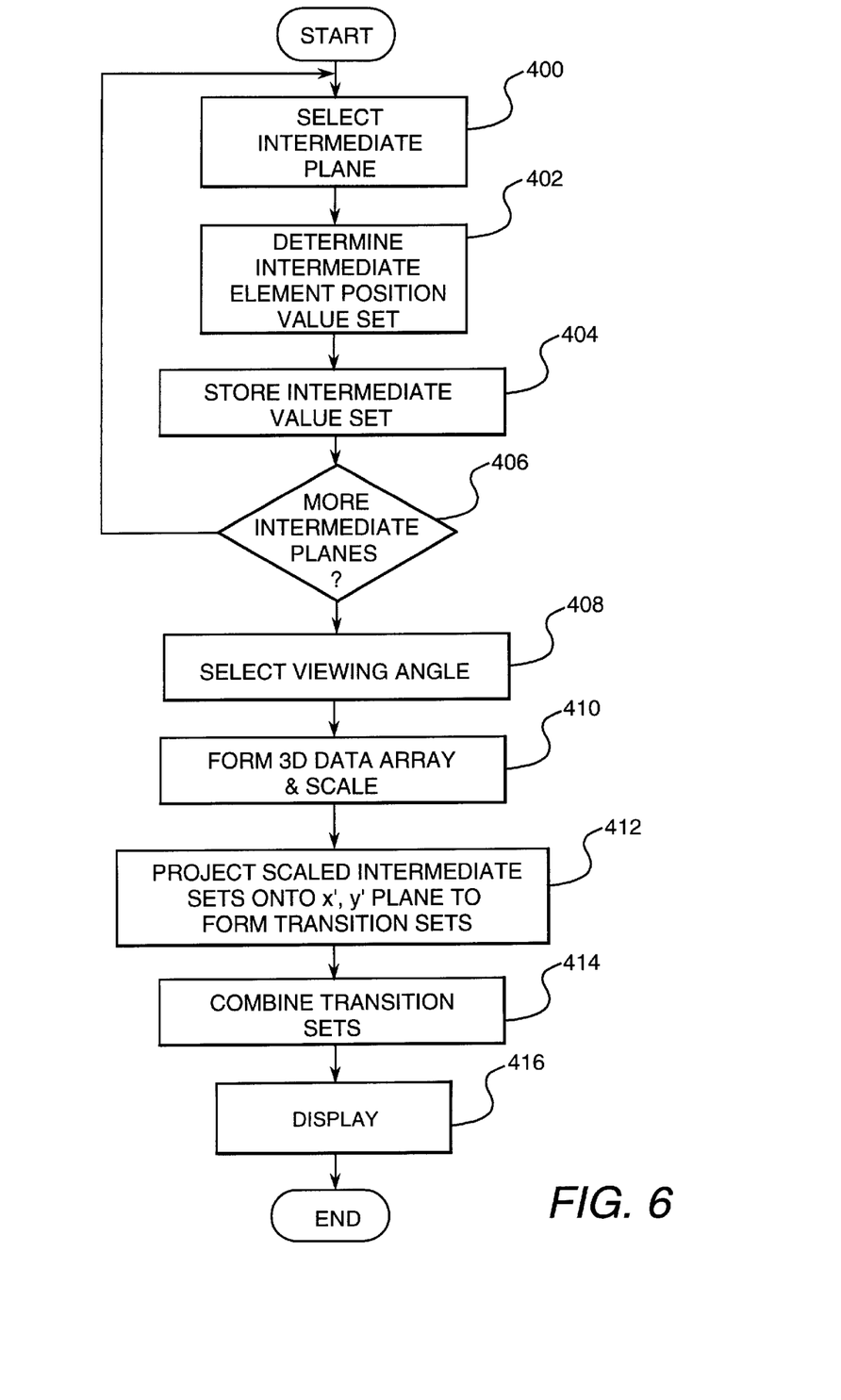
FIG. 6 is a flow chart illustrating a preferred method of operation of the invention.

In the interest of simplicity, operation of the system is described in conjunction with FIG. 6 in the context of a relatively simple coronary artery portion 250 (hereinafter artery 250) as shown in FIG. 3. Artery 250 includes three adjacent sections 250a, 250b and 250c which generally are aligned in different planes. In addition, it is assumed that a desired view of artery 250 is along the direction of a viewing angle indicated by arrow 252 (hereinafter "angle 252").

Figure 4:
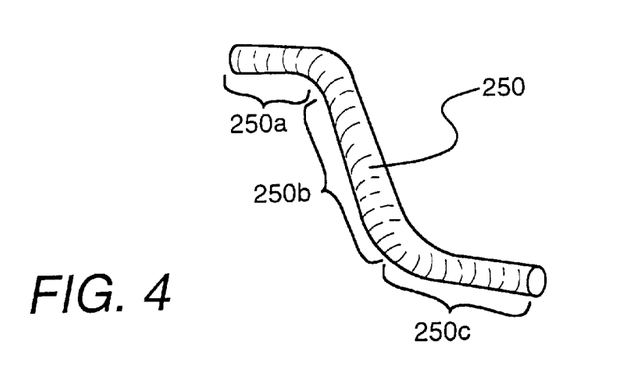
FIG. 4 is a schematic illustration of the vessel of FIG. 3 from the viewing angle indicated in FIG. 3.

In FIG. 4, artery 250 is illustrated as it would appear from viewing angle 252 in FIG. 3. It can be seen that artery 250 is tortuous, generally having a bent shape into angle 252 (FIG. 3) and an inverted "S" shape from the perspective of angle 252 (FIG. 4). Clearly artery 250 is multiplanar and therefore an image of artery 250 cannot be generated using data from a single plane.

Referring also to FIGS. 1 and 5, an operator uses console 100 to display a cross sectional view through the region of interest by selecting depth and orientation of a cut plane through the region of interest using depth generator 258 and orientation generator 256.

The operator modifies the depth and orientation selections until a cross section of the heart, including at least a portion of coronary artery 250 to be imaged, is displayed. The portion of artery 250 selected for viewing may simply be a cross section and therefore appear similar to the end of a tube, or a dot. Once artery 250 is identified, the operator again modifies the depth and orientation selections until a lengthwise section of artery 250 is displayed. For example, artery 250 may appear as in FIG. 3, after this manipulation.

Figure 7:
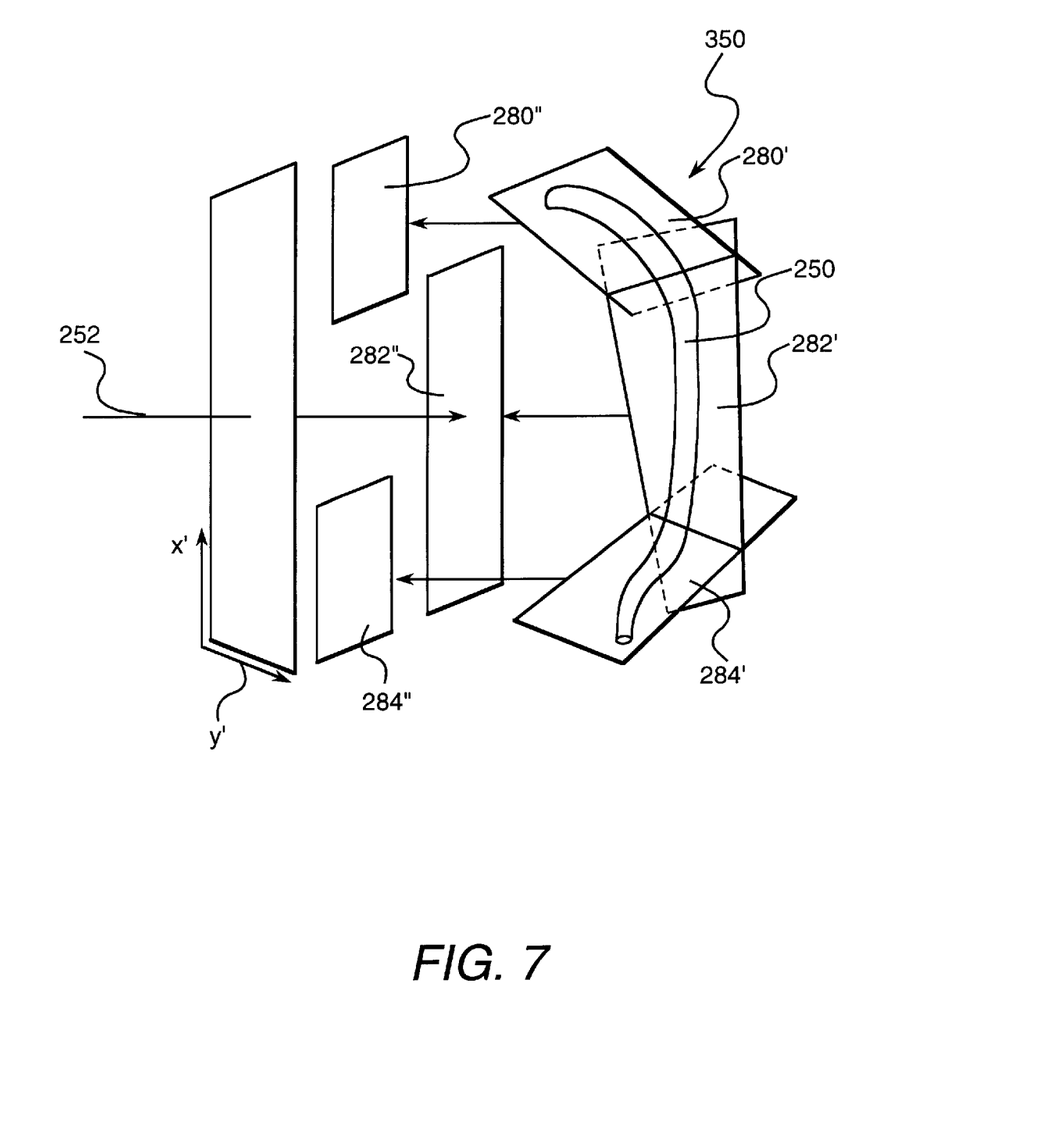
FIG. 7 is a schematic diagram illustrating the vessel of FIG. 3 and schematically illustrating intermediate and transition data sets according to a preferred embodiment of the invention.

The remainder of the method of operation is illustrated in FIG. 7. With the lengthwise piece of artery 250 displayed, at step 400 the operator uses orientation generator 256 and depth generator 258 to select a first intermediate plane 280 which, as shown in FIG. 3, includes first artery section 250a. This selecting step 400 may be as easy as using an input device to move an intermediate plane line across the displayed image until the line is aligned with section 250a. In this event, generators 256 and 258 could be provided by a single input device.

When plane 250a is selected, at step 402 intermediate plane selector 262 generates the plane element positions which correspond to the selected plane and intermediate element value determiner 264 determines the values of each element position in the selected intermediate plane as described above. These values are stored at step 404 as a first intermediate element position value set in memory 113. The first intermediate value set is schematically and graphically illustrated in FIG. 7 as a plane of data points 280'.

Because there are two additional intermediate planes 282 and 284 to be imaged, at decision step 406, the process loops back to step 400 where the operator uses generators 256 and 258 to now select a second intermediate plane 282 which includes second artery section 250b. When plane 282 is selected, at step 402 intermediate plane selector 262 generates the plane element positions which correspond to the selected plane and intermediate element value determiner 264 determines the values of each element position in the selected plane, the values being stored at step 404 as a second intermediate element position value set in memory 113. The second intermediate element position value set is illustrated in FIG. 7 as a plane of data points 282'.

Once again, at step 400 the operator uses generators 256 and 258 to select a third intermediate plane 284 which includes third artery section 250c. When plane 284 is selected, at step 402 intermediate plane selector 262 generates the plane element positions which correspond to the selected plane and intermediate element value determiner 264 determines the values of each element position in the selected plane, the values being stored at step 404 as a third intermediate element position value set in memory 113. The third intermediate element position value set is illustrated in FIG. 7 as a plane of data points 284'. Data sets 280', 282' and 284' can be seen to overlap. Now, at decision step 406, because there are no other intermediate planes to be imaged in the present example, control passes to step 408.

In addition to selecting the intermediate planes, at step 408 the operator uses viewing angle selector 260 to select a viewing angle from which to examine artery 250. In this example, with reference to FIGS. 3 and 6; the operator selects angle 252. Thereafter, at step 410, transition element value determiner 266 retrieves the intermediate element value sets from memory 113 and generates a three dimensional data point construct 350 (FIG. 7) including a data point for each intermediate element value in the retrieved value sets. To this end, intermediate arrays 280', 282' and 284' are retrieved and, as shown in FIG. 7, three dimensional construct 350 is formed. In addition, at step 410, transition element value determiner 266 identifies the dimensions of data point construct 350 in the x'–y' plane (i.e. the plane perpendicular to viewing angle 252), compares array 350 x' and y' dimensions to the dimensions of the screen of display 118 and scales the entire data point construct 350 either up or down, depending on the difference between the screen dimensions and the array 350 x' and y' dimensions. For example, if construct 350 x' and y' dimensions are each half the dimensions of display 118, size of construct 350 is increased by a factor of 2.

After scaling the data point construct for each scaled intermediate value set, transition element value determiner 266, at step 412, projects each value set onto the viewing angle x'–y' plane thereby generating three transition element value sets 280", 282" and 284", respectively, in the viewing angle plane, as shown in FIG. 7. Many methods for performing such projection are known in the art and are therefore are not explained here in detail.

After all of the transition element value sets have been generated, combine 268, at step 414, retrieves the transition sets and combines the sets to generate a separate viewing element position value for each display pixel. Preferably, combiner 268 performs step 414 by performing a maximum intensity projection (MIP) on the transition element value sets, thereby providing data for generating a two dimensional image on display 118 (FIG. 1). The MIP data (i.e. viewing element position values) are stored in memory 113.

At step 416, driver 270 retrieves the MIP data and uses that data to drive display 118 in any of several different manners which are well known in the industry, thereby providing a multi-oblique plane MIP image for artery study.

If desired, after step 406 and storage of all intermediate value sets, the operator can select one viewing angle at step 408 and, if the resulting MIP is unsatisfactory, the operator can go back to step 408 and select a different, perhaps more suitable viewing angle, using the same intermediate value sets to generate a second MIP corresponding to the newly chosen angle.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A system for displaying images of a three dimensional data array, the array including signal patterns representing the value of at least one physical property associated with a three dimensional body at regularly spaced grid locations defining volume elements within the body, the system comprising:

a plane selector for arbitrarily choosing at least first and second intermediate planes through the body, the first and second intermediate planes including first and second sets of intermediate element positions, respectively;

a determiner for determining the physical property value for each position of the first and second element position sets, thereby generating first and second intermediate element value sets, respectively;

a viewing angle selector for selecting a viewing plane adjacent the intermediate planes, the viewing plane including viewing element positions;

a processor for combining the intermediate element value sets to generate a value for each viewing element position;

a two dimensional display for displaying an image; and a driver for receiving the viewing element positions and corresponding values and driving said display to produce an image on the display.

2. The system of claim 1 wherein the processor is adapted to project the intermediate element value sets onto the viewing plane to generate a set of transition element values for each intermediate element value set and to merge sets of transition element values to generate a value for each viewing element position.

3. The system of claim 2 wherein the processor is adapted to merge the sets of transition element values by performing a maximum intensity projection from the perspective of the viewing element positions to generate the viewing element position values.

4. The system of claim 1 including an orientation generator and a depth generator coupled to the plane selector, said orientation generator being adapted to specify angular orientation of a cut plane through a region of interest in the body and said depth generator being adapted to select depth of the cut plane, such that said plane selector is capable of rotating and displacing the cut plane to correspond to an arbitrarily chosen cut plane in the body.

5. The system of claim 1 including a transition element value determiner, and a viewing angle selector coupled to the transition element value determiner for selecting a viewing plane, the viewing plane including viewing plane element positions, wherein the value determiner is adapted to determine a value for each element position in the selected plane and to provide the determined values to said processor.

6. The system of claim 5 including a memory for storing the values determined by the value determiner for each element position in the selected plane.

7. The system of claim 6 wherein the processor is adapted to retrieve and combine transition sets stored in said memory by performing a maximum intensity projection from the perspective of the viewing element positions.

8. The method of claim 1 wherein the processor is adapted to combine the intermediate element value sets by performing a maximum intensity projection of the intermediate element value sets from the perspective of the viewing element positions.

9. A method for displaying images of a three dimensional data array, the array including signal patterns representing the value of at least one physical property associated with a three dimensional body at regularly spaced grid locations defining volume elements within the body, the method comprising the steps of:

arbitrarily choosing at least first and second intermediate planes through the body, the first and second intermediate planes including first and second intermediate sets of element positions, respectively;

determining for each of the first and second element position sets, the physical property value for each position, thereby generating first and second intermediate element value sets, respectively;

selecting a viewing plane adjacent the intermediate planes, the viewing plane including viewing element positions;

combining the intermediate element value sets to generate a value for each viewing element position; and displaying the viewing element position values as a two dimensional display.

10. The method of claim 9 wherein the step of combining includes the steps of projecting the intermediate element value sets onto the viewing plane to generate a transition element value set for each intermediate set and merging transition element sets to generate a value for each viewing element position.

11. The method of claim 10 wherein the step of merging the transition element value sets includes the step of performing a maximum intensity projection from the perspective of the viewing element positions to generate the viewing element position values.

12. The method of claim 9 wherein the step of arbitrarily choosing includes the step of identifying at least first and second initial planes, each initial plane including a two dimensional array of element positions, and rotating and displacing the planes to correspond to the arbitrarily chosen cut planes through the body.

13. The method of claim 9 wherein the viewing plane is defined by x' and y' coordinates and the step of combining includes the steps of forming a three dimensional data set out of the intermediate element value sets, determining the x' and y' dimensions of the three dimensional data set, comparing the x' and y' dimensions to the dimensions of the display, scaling the three dimensional array so that the array x' and y' dimensions are as large as possible while still fitting on the display, projecting each scaled intermediate element value set onto the x' and y' plane to generate a transition set, and merging the transition sets, together to generate a value for each viewing element position.

14. The method of claim 13 wherein the step of merging transition sets includes the step of performing a maximum intensity projection from the perspective of the viewing element positions.

15. The method of claim 9 wherein the step of combining includes the step of performing a maximum intensity projection of the intermediate element value sets from the perspective of the viewing element positions.

16. A system for displaying at least first and second two dimensional oblique planar images, the first and second images including first and second element position sets, respectively, and including a property value for each element position, the values corresponding to the first image and the second image being first and second intermediate element value sets, respectively, each property value corresponding to a physical property associated with a three dimensional body, the system comprising:

a viewing angle selector for selecting a viewing plane including viewing element positions;

a processor for combining the intermediate element value sets to generate a value for each viewing element position;

a two dimensional display for displaying an image; and a driver for receiving the viewing element positions and corresponding values and for driving said display to produce an image on the display.

17. The system of claim 16 wherein the processor is adapted to project the intermediate element value sets onto the viewing plane to generate a transition element value set for each intermediate element value set and to merge transition element value sets to generate a value for each viewing element position.

18. A method for displaying at least first and second two dimensional oblique planar images, the first and second images including first and second element position sets, respectively, and including a property value for each element position, the values corresponding to the first image and the second image being first and second intermediate element value sets, respectively, each property value corresponding to a physical property associated with a three dimensional body, the method comprising the steps of:

selecting a viewing plane including viewing element positions;

combining the intermediate element value sets to generate a value for each viewing element position; and displaying the viewing element position values.

19. The method of claim 18 wherein the step of combining includes the steps of projecting the intermediate element value sets onto the viewing plane to generate a transition element value set for each intermediate element value set and merging transition element value sets to generate a value for each viewing element position.

20. The method of claim 19 wherein the step of merging the transition element value sets includes the step of performing a maximum intensity projection from the perspective of the viewing element positions to generate the viewing element position values.

* * * * *